(12) United States Patent
Davies

(10) Patent No.: US 7,880,198 B2
(45) Date of Patent: Feb. 1, 2011

(54) FIELD EFFECT TRANSISTOR HAVING MULTIPLE PINCH OFF VOLTAGES

(75) Inventor: Richard Alun Davies, Darlington (GB)

(73) Assignee: RFMD (UK) Limited, Newton Aycliffe (GB)

(*) Notice: Subject to any disclaimer, the term of this patent is extended or adjusted under 35 U.S.C. 154(b) by 687 days.

(21) Appl. No.: 11/756,170

(22) Filed: May 31, 2007

(65) Prior Publication Data
US 2007/0278520 A1 Dec. 6, 2007

(30) Foreign Application Priority Data
May 31, 2006 (GB) ................... 0610683.5

(51) Int. Cl.
*H01L 31/00* (2006.01)
(52) U.S. Cl. .................................... 257/192
(58) Field of Classification Search ......... 257/213–413, 257/428, 40, 57, 59, 61, E51.012, E27.117, 257/900, 902, 903, E21.19–21.21, E21.394–E21.458, 257/E21.615–E21.694, 96, 97, 183, 192, 257/194, 197, 200, E29.039–E29.041, 20, 257/E29.246–29.253; 438/135, 142
See application file for complete search history.

(56) References Cited

U.S. PATENT DOCUMENTS 5,834,802 A * 11/1998 Takahashi et al. ........... 257/280

| 7,397,072 B2 * | 7/2008 | Dodabalapur et al. ....... 257/226 |
| 2005/0110054 A1 * | 5/2005 | Wohlmuth ................ 257/267 |
| 2005/0151208 A1 | 7/2005 | Uno et al. |

FOREIGN PATENT DOCUMENTS

| EP | 0442413 | 8/1991 |
| JP | 60176277 | 2/1984 |
| JP | EP0442413 | * 8/1991 |

OTHER PUBLICATIONS

Search Report for Application No. GB0610683.5, date of search Sep. 28, 2007.

* cited by examiner

*Primary Examiner*—Dao H Nguyen
*Assistant Examiner*—Tram H Nguyen
(74) *Attorney, Agent, or Firm*—Withrow & Terranova, P.L.L.C.

(57) ABSTRACT

A compound field effect transistor having multiple pinch-off voltages comprising: first and second field effect transistors, each field effect transistor comprising a semiconductor layer, the semiconductor layer having an electrically conducting layer therein; an ohmic contact layer on the semiconductor layer; a source and a drain on the ohmic contact layer; at least one gate on the semiconductor layer between source and drain; at least one gate of the first transistor and one gate of the second transistor being matched gates, each gate having the same effective thickness of electrically conducting layer beneath it but the gates having different gate lengths.

16 Claims, 6 Drawing Sheets

FIELD EFFECT TRANSISTOR HAVING MULTIPLE PINCH OFF VOLTAGES

The subject patent application claims priority to and all the benefits of United Kingdom Patent Application No. 0610683.5, which was filed on May 31, 2006 with the UK Patent Office.

The present invention relates to a compound field effect transistor having multiple pinch-off voltages and a method of manufacture of such a field effect transistor. More preferably but not exclusively, the present invention relates to a compound field effect transistor having a pair of matched gates, the matched gates each being the same effective distance above the bottom of the electrically conducting channel below the gate but having a different gate length.

Compound field effect transistors (FETs) having multiple pinch-off voltages separating on and off states are known. Such compound FETs comprise first and second FETs on a shared support layer. Each of the FETs comprises a semiconductor substrate having an electrically conducting channel therein. A gate sits in a recess in each substrate above the channel. The recesses are of different depths so that the gates are different heights above the bottom of the electrically conducting channel. The pinch-off voltages for the gates are therefore different. Such a compound FET is difficult to manufacture requiring separate steps of masking, etching and metal deposition to produce the recesses of different depths. This increases manufacturing costs and reduces yield.

Accordingly, the present invention provides a compound field effect transistor having multiple pinch off voltages comprising:

First and second field effect transistors, each field effect transistor comprising
a semiconductor layer, the semiconductor layer having an electrically conducting layer therein;
an ohmic contact layer on the semiconductor layer;
a source and a drain on the ohmic contact layer;
at least one gate on the semiconductor layer between source and drain;
at least one gate of the first transistor and one gate of the second transistor being matched gates, each gate having the same effective thickness of electrically conducting layer beneath it but the gates having different gate lengths.

The compound field effect transistor according to the invention has multiple pinch-off voltages with each of the gates being the same effective distance above the bottom of the semiconductor channel layer. This simplifies manufacture and increases yield.

Preferably, the first and second field effect transistors share a common semiconductor layer.

The first and second field effect transistors can share a common ohmic contact layer.

Preferably, the matched gates of the first and second transistors are located within recesses in their respective semiconductor layer.

Preferably, the recesses in the first and second semiconductor layer are the same depth.

Preferably, one transistor is an enhancement mode transistor and one transistor is a depletion mode transistor.

Preferably, the aspect ratio of one of the gates of the matched pair of gates is greater than three, preferably greater than five.

Preferably, the aspect ratio of one of the gates of the matched pair of gates is less than three, preferably greater than one.

Each of the electrically conducting layers can be GaAs.
Each of the field effect transistors can be a pHEMT.

At least one of the first and second transistors can comprise a plurality of gates. Two of the plurality of gates can have the same gate length and can be matched with a gate on the other transistor of the compound field effect transistor.

In an alternative aspect of the invention there is provided a field effect transistor having multiple pinch-off voltages comprising:
a semiconductor layer having an electrically conducting layer therein;
an ohmic contact layer on the semiconductor layer;
a source and drain on the ohmic contact layer;
a plurality of gates on the semiconductor layer between source and drain, at least two of the gates having different gate lengths.

Preferably, the plurality of gates are arranged within a recess in the semiconductor layer.

In a further aspect of the invention there is provided a method for manufacture of a compound field effect transistor comprising the steps of:
providing first and second semiconductor layers each semiconductor layer having an electrically conducting later therein;
providing an ohmic contact layer on each of the semiconductor channel layers;
providing a source and a drain on each ohmic contact layer;
providing a mask on the ohmic contact layers;
providing a pattern on the mask, the pattern comprising a first via extending through the mask to the ohmic contact layer between the source and drain of the first transistor and a second via extending through the mask to the ohmic contact layer between the source and drain of the second transistor;
etching through the ohmic contact layer to the semiconductor layer;
depositing first and second gates on the semiconductor layers through the vias, the vias being arranged such that the first and second gates have different gate lengths.

Preferably, the method further comprises the step of etching recesses of the same depth in the semiconductor layers through the first and second vias prior to depositing the gates through the vias.

Preferably, the first and second semiconductor layers are different parts of the same semiconductor layer.

In a further aspect of the invention there is provided a method of manufacture of a field effect transistor comprising the steps of:
providing a semiconductor layer having an electrically conducting layer therein;
providing an ohmic contact layer on the semiconductor layer;
providing a source and a drain on the ohmic layer;
providing a mask on the ohmic contact layer;
providing a plurality of vias extending through the mask to the ohmic contact layer between the source and the drain;
etching through the ohmic contact layer to the semiconductor layer;
depositing a plurality of gates through vias on the semiconductor layer, the vias being arranged such that at least two of the gates have different gate lengths.

Preferably, the method further comprises the steps of etching a plurality of recesses of the same depth in the semiconductor layer through the vias prior to depositing the gates.

The present invention will now be described by way of example only and not in any limitative sense with reference to the accompanying drawings in which FIG. 1 shows a known compound FET having multiple pinch-off voltages;

Figure 1:
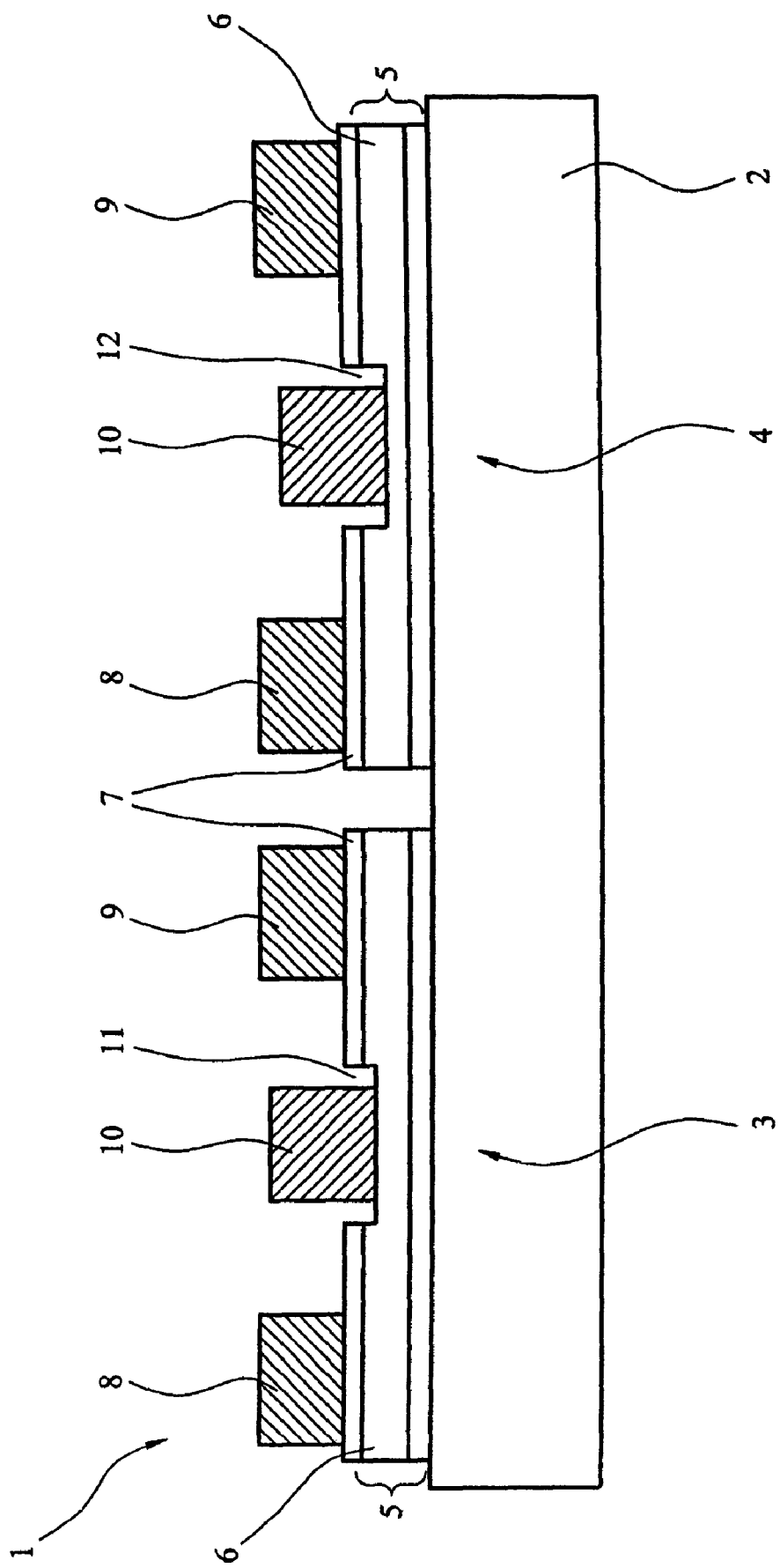

Shown in FIG. 1 is a known compound FET 1 having a multiple pinch off voltages. The FET 1 comprises a support layer 2. On the support layer 2 are first and second FETs 3,4. Each FET 3,4 comprises a semiconductor layer 5 having an electrically conducting layer 6 therein. On each semiconductor layer 5 is an ohmic contact layer 7. On each ohmic contact layer 7 is a source 8 and a drain 9. Arranged between each source 8 and drain 9 on the semiconductor layer 5 is a gate 10.

The two gates 10 are different heights above the electrically conducting layer 6. Accordingly the two FETs 3,4 have different pinch-off voltages.

Each semiconductor layer 5 comprises two etch stop layers (not shown). To manufacture the compound FET 1 the semiconductor layer 5 is etched down to the top etch stop layer to provide a first recess 11. The top etch stop layer is then removed and the first gate 10 deposited. A second recess 12 is then etched down to the top etch stop layer. The exposed top etch stop layer is removed and the recess further etched down to the bottom etch stop layer. The exposed part of the bottom etch stop layer is then removed and a further gate 10 deposited.

The extra steps required increases manufacturing costs and reduces yield.

Figure 2:
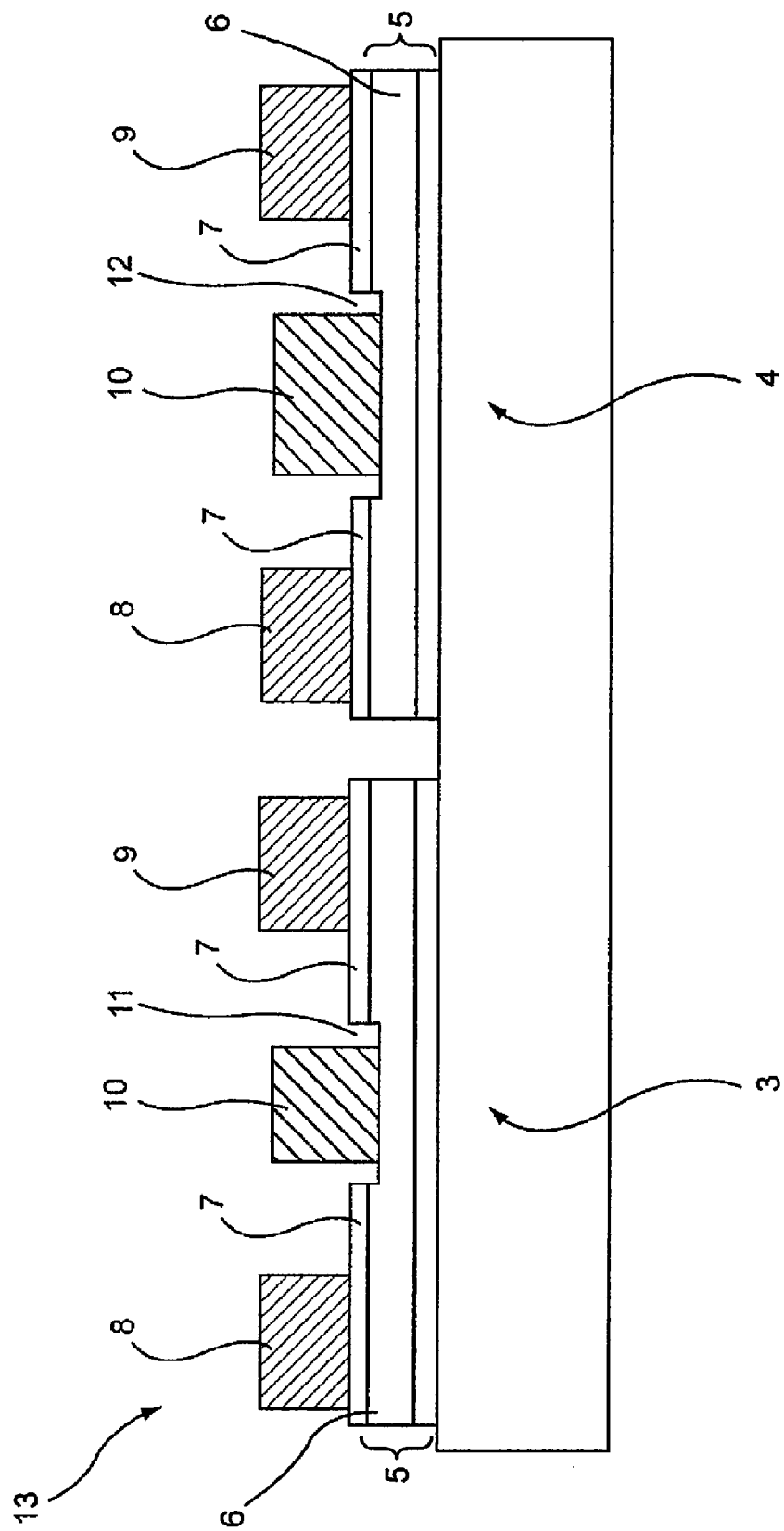
FIG. 2 shows a compound FET according to the invention.

Shown in FIG. 2 is a compound field effect transistor 13 according to the invention. The FET 13 is similar to that of FIG. 1 except that the two recesses 11,12 in the semiconductor layer 5 are of the same depth. In contrast to the FET 1 of FIG. 1 the gates 10 are of a different length as shown.

The distribution of electrons in the electrically conducting layer 5 beneath the gate 10 may be a complex function of the depth beneath the gate 10. The electrons could be arranged in a thin sheet beneath the gate 10 (delta doping). Alternatively, the electrons could be uniformly distributed in a thick layer beneath the gate 10 (bulk doping). More complex distributions of electrons which vary with depth beneath the gate 10 are possible. Performance of gates 10 having different conducting layer electron distributions can however be characterised by reference to the aspect ratios of the gates 10. The aspect ratio is the ratio of the gate length to the effective thickness of the electrically conducting layer 6 beneath it. The aspect ratio can be calculated numerically or measured experimentally. Aspect ratio and effective thickness are known terms in the semiconductor field.

The variation of pinch-off voltage of a FET with gate length (the short channel effect) is known. The gates 10 of the two FETs 3,4 of the compound FET 13 of FIG. 2 have the same electrically conducting layer 6 beneath them. As they are both within recesses 11,12 of the same depth they both have the same effective electrically conducting layer thickness. The different lengths of the two gates 10 means that the two gates 10 have different aspect ratios and hence different pinch-off voltages.

In this embodiment one of the FETs 3,4 of the compound FET 13 is an enhancement mode FET and the other FET 3,4 is a depletion mode FET, In an alternative embodiment both FETs 3,4 are enhancement mode FETs. In a further embodiment both FETs 3,4 are depletion mode FETs.

For this embodiment one gate 10 has a gate length of 2 micron under which is formed an electrically conducting layer 0.3 micron thick. This gate 10 has an aspect ratio of 6.7. The gate 10 of the other FET is only 0.5 micron in length giving an aspect ratio of 1.7 and hence a significantly different pinch-off voltage.

As the two recesses 11,12 are of the same depth only one gate formation step is required in the manufacture of the compound FET 13. This reduces manufacturing cost and increases yield.

For an aspect ratio greater than about three the pinch-off voltage of the gate 10 becomes substantially insensitive to the gate length. Typically, one of the gates 10 of the compound FET 13 of the invention has an aspect ratio in this region.

Below an aspect ratio of three the pinch-off voltage of the associated FET becomes dependant on gate length. Accordingly, the remaining gate 10 of the compound FET 13 has an aspect ratio in this region. There are other short channel effects with undesirable properties. To avoid these the aspect ratio of the remaining gate 10 is constructed to be larger than unity.

The compound FET 13 of FIG. 2 has only two gates 10. If more than two pinch-off voltages are required the compound FET 13 according to the invention could have three or possibly more FETs.

The FETs 3,4 of the compound FET 13 of FIG. 2 are pHEMTS having a GaAs electrically conducting layer 6. The underlying mechanism which is the use of variations of pinch-off voltage with gate length can be used with all classes of FET in all semiconductors.

Figure 3:
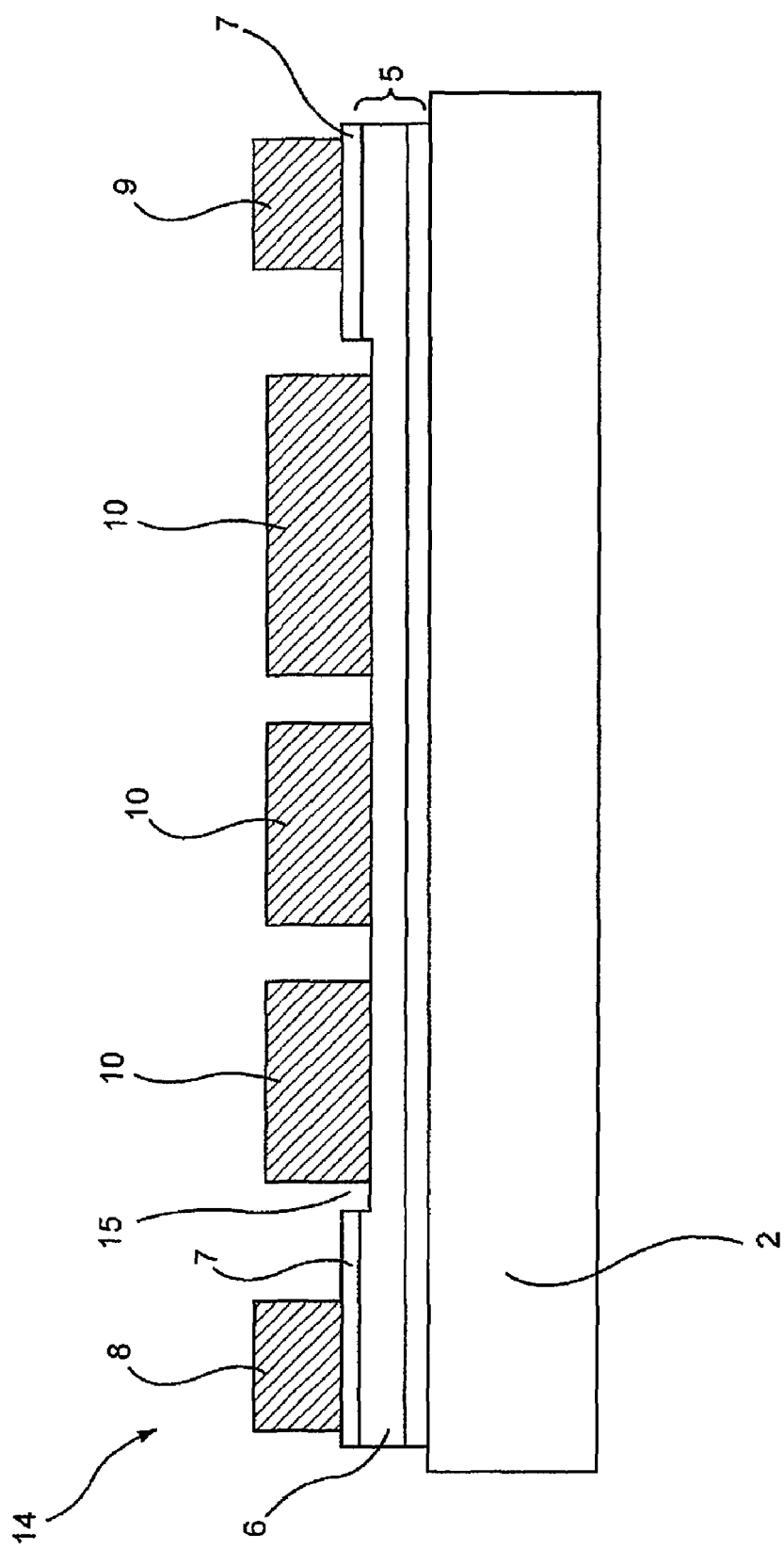
FIG. 3 shows a further embodiment of a FET according to the invention.

Shown in FIG. 3 is an embodiment of a FET 14 according to the invention. The FET 14 comprises a semiconductor layer 5 having an electrically conducting layer 6. On the semiconductor layer 5 is an ohmic contact layer 7. On the ohmic contact layer 7 is a source 8 and a drain 9. Between the source 8 and drain 9 is a recess 15 extending to the semiconductor layer 5. A plurality of gates 10 are positioned within the recess 15. At least two of the gates 10 are of different lengths and consequently have different pinch-off voltages.

In a further aspect of the invention (not shown) each of the FETs 3,4 of the compound FET 14 has a different electrically conducting layer 6 beneath its respective gate 10. The electrically conducting layers 6 are arranged to have the same effective conducting layer thickness.

Figure 4:
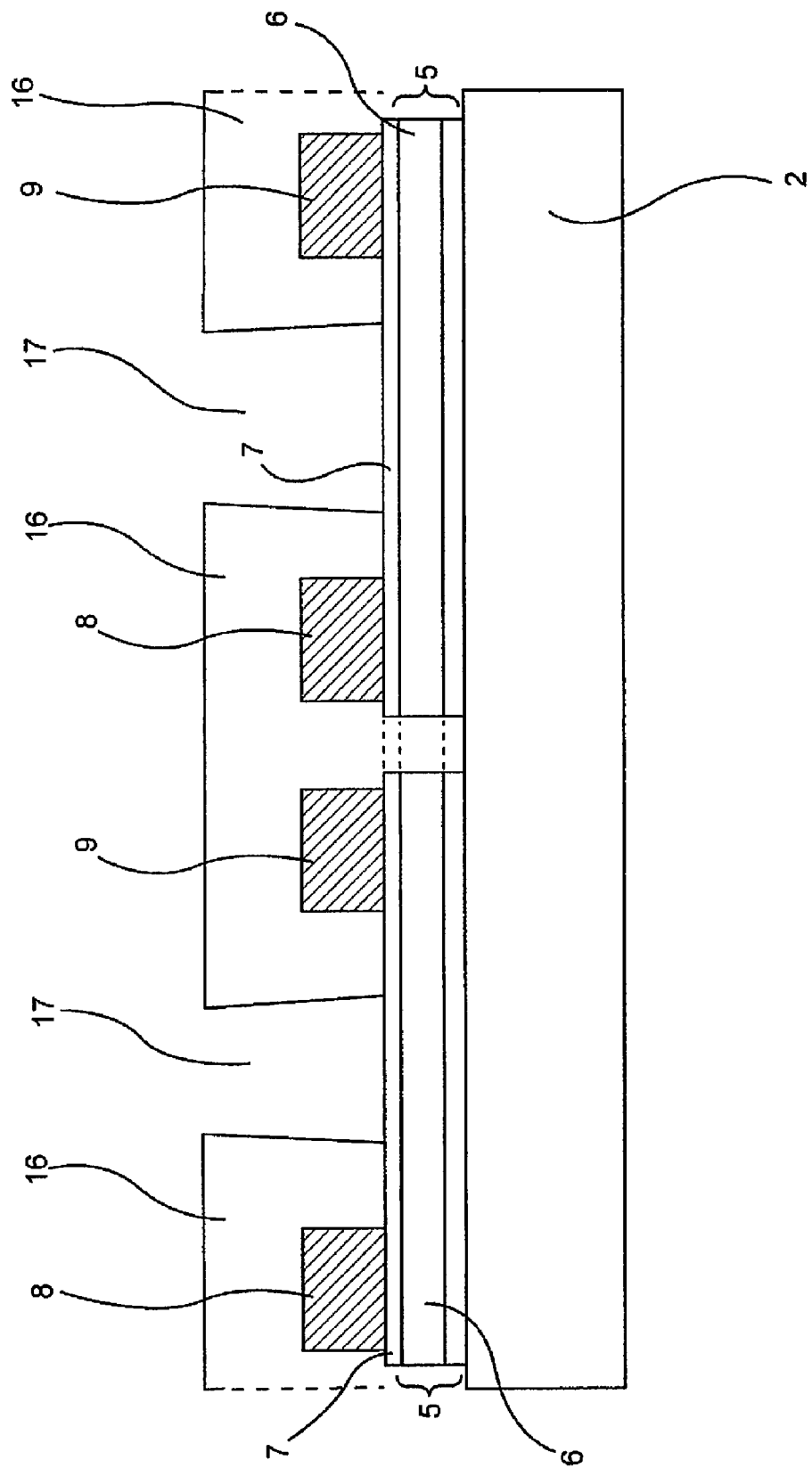
FIG. 4 to 6 show steps in the manufacture of a compound FET according to the invention.
Figure 5:
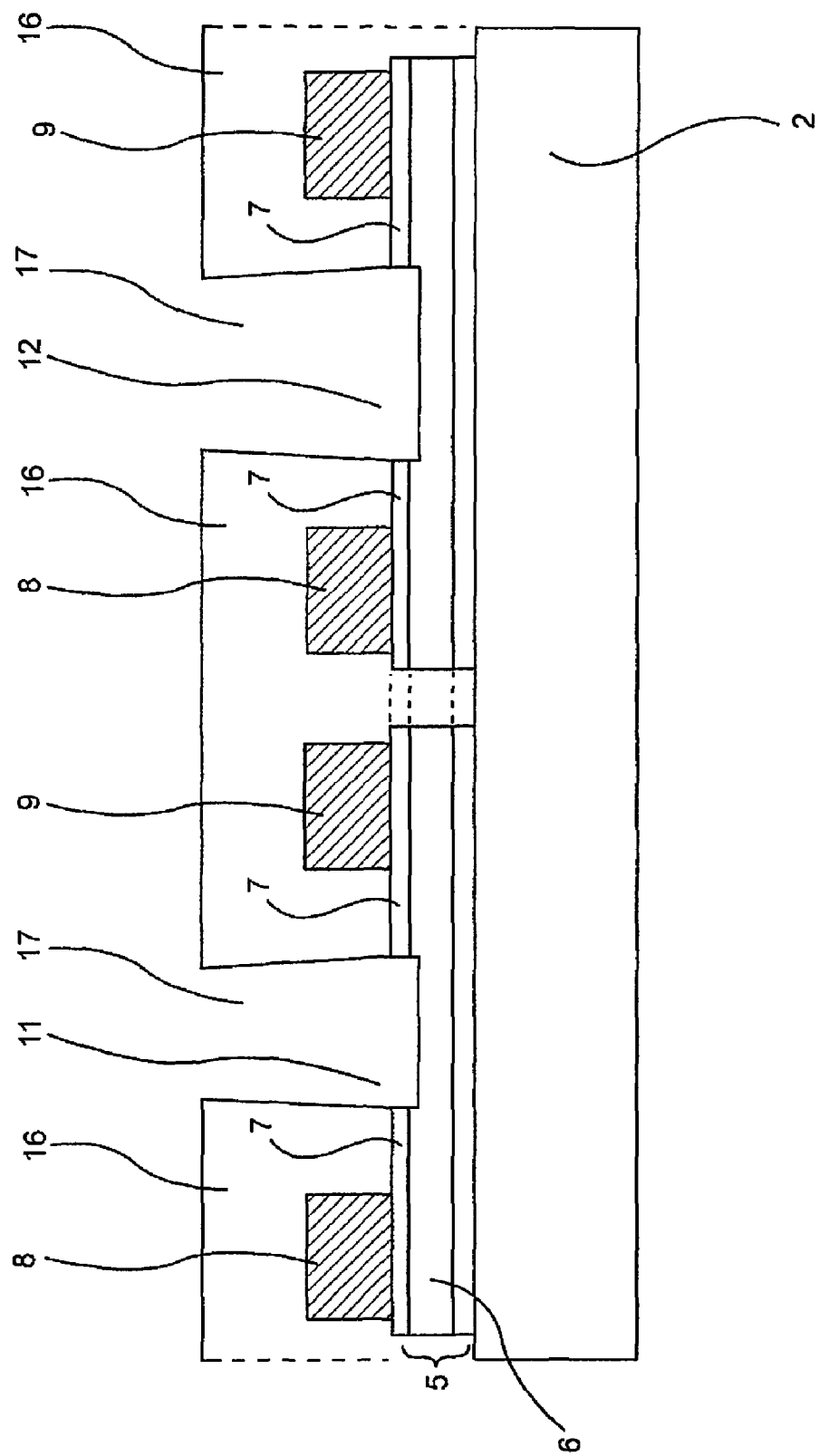
Figure 6:
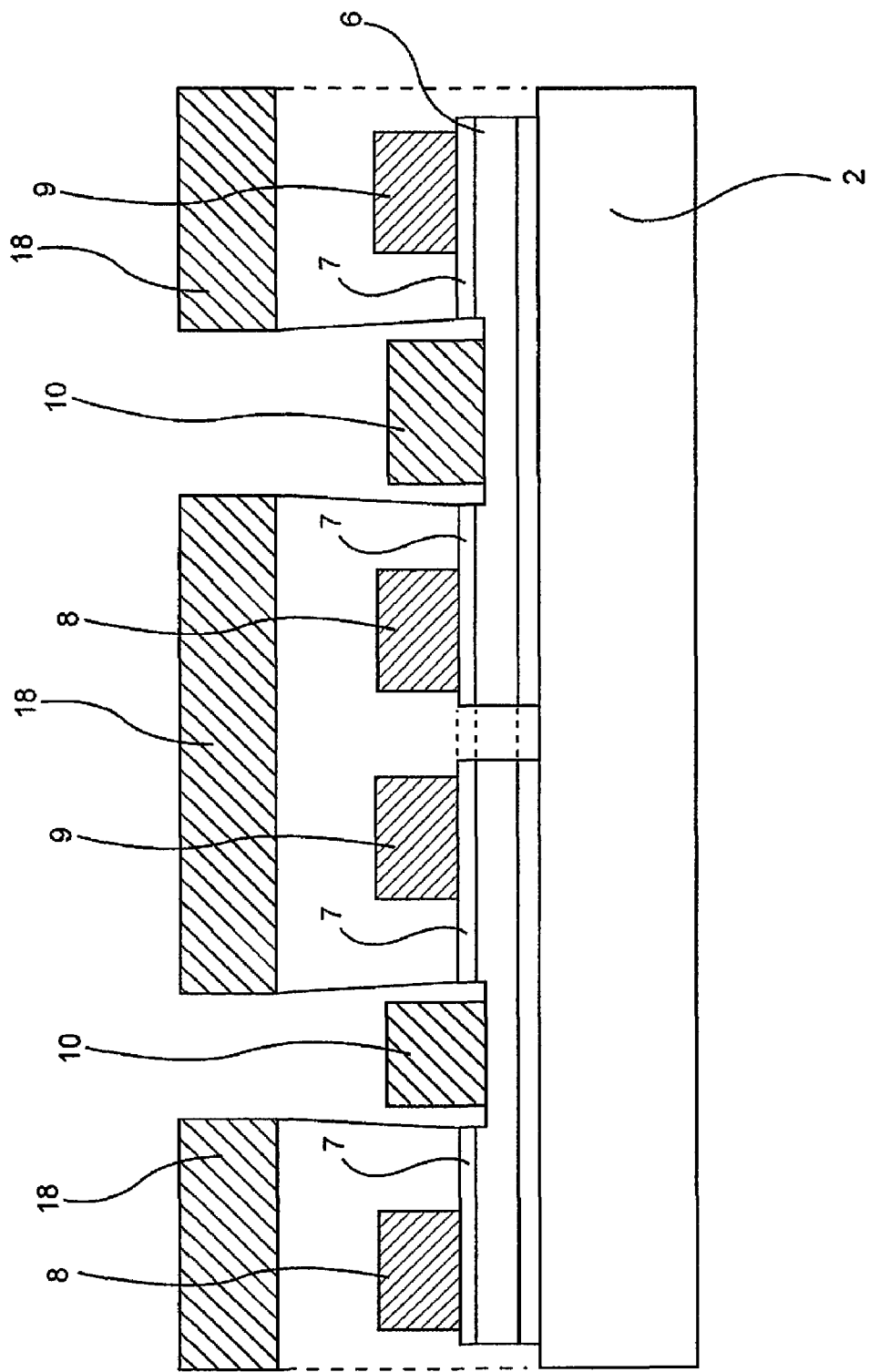

Shown in FIGS. 4 to 6 is an example of a method of manufacture of a compound FET 13 according to the invention.

Firstly, a support layer 2 is provided. First and second semiconductor layers 5 are provided on the support layer 2. Each semiconductor layer 5 comprises an electrically conducting layer 6. Ohmic contact layers 7 are provided on the semiconductor layers 5. Provided on each ohmic contact layer 7 is a source 8 and a drain 9.

A layer of resist 16 is deposited on the ohmic contact layers 7 and slots 17 created in it (usually by photolithography). Two different sized slots 17 are created.

Next, a shallow etch is performed through the ohmic contact layer 7 and into the semiconductor layer 5 to produce a recess 11,12. To control the depth an etch stop layer (not shown) is included in the semiconductor layer 5. The cross section of the etch is shown in FIG. 5.

After etching, metal to form the gates 10 is deposited. Additional metal 18 is deposited on the resist 16 as shown in FIG. 6. Finally, the resist 16 is removed to form the compound FET 13 of FIG. 2.

The etching of a recess 11,12 in the semiconductor layer 5 before the depositing of the gate 10 is not an essential step of the method. It is however to be preferred as it gives a compound FET with desirable properties.

The invention claimed is:

1. A compound field effect transistor having multiple pinch-off voltages comprising:

first and second field effect transistors, each field effect transistor comprising:
- a semiconductor layer, the semiconductor layer having an electrically conducting layer therein;
- an ohmic contact layer on the semiconductor layer;
- a source and a drain on the ohmic contact layer; and
- at least one gate on the semiconductor layer between the source and the drain;
- the at least one gate of the first transistor and the at least one gate of the second transistor being matched gates, each gate having the same effective thickness of the electrically conducting layer with each gate having different gate lengths.

2. A compound field effect transistor as claimed in claim 1, wherein the first and second field effect transistors share a common semiconductor layer.

3. A compound field effect transistor as claimed in claim 1, wherein the first and second field effect transistors share a common ohmic contact layer.

4. A compound field effect transistor as claimed in claim 1, wherein the matched gates of the first and second transistors are located within recesses in their respective semiconductor layers.

5. A compound field effect transistor as claimed in claim 4, wherein the recesses in the first and second semiconductor layers are the same depth.

6. A compound field effect transistor as claimed in claim 1, wherein one of the first and second transistors is an enhancement mode transistor and another of the first and second transistors is a depletion mode transistor.

7. A compound field effect transistor as claimed in claim 1, wherein an aspect ratio of one of the gates of the matched pair of gates is greater than three.

8. A compound field effect transistor as claimed in claim 1, wherein an aspect ratio of one of the matched pair of gates is less than three.

9. A compound field effect transistor as claimed in claim 1, wherein each of the electrically conducting layers is GaAs.

10. A compound field effect transistor as claimed in claim 1, wherein each of the field effect transistors is a pHEMT.

11. A compound field effect transistor as claimed in claim 1, wherein at least one of the first and second transistors comprises a plurality of gates.

12. A compound field effect transistor as claimed in claim 11, wherein two of the plurality of gates of one of the transistors have the same gate length and are matched with a gate on the other transistor of the compound field effect transistor.

13. A field effect transistor having multiple pinch-off voltages comprising:
- a semiconductor layer having an electrically conducting layer therein;
- an ohmic contact layer on the semiconductor layer;
- a source and a drain on the ohmic contact layer; and
- a plurality of gates on the semiconductor layer between the source and the drain, at least two of the gates being matched gates, having the same effective thickness of the electrically conducting layer and having different gate lengths.

14. A field effect transistor as claimed in claim 13, wherein the plurality of gates are arranged within a recess in the semiconductor layer.

15. A compound field effect transistor as claimed in claim 7, wherein an aspect ratio of one of the gates of the matched pair of gates is greater than five.

16. A compound field effect transistor as claimed in claim 8, wherein an aspect ratio of one of the matched pair of gates is between one and three.

* * * * *